United States Patent [19]
Wada et al.

[11] Patent Number: 5,629,236
[45] Date of Patent: May 13, 1997

[54] METHOD OF MANUFACTURE OF SEMICONDUCTOR DEVICE

[75] Inventors: Jun-ichi Wada, Yokohama; Hisashi Kaneko, Fujisawa; Nobuo Hayasaka, Yokosuka, all of Japan

[73] Assignee: Kabushiki Kaisha Toshiba, Kawasaki, Japan

[21] Appl. No.: 506,483

[22] Filed: Jul. 25, 1995

[30] Foreign Application Priority Data

| Jul. 26, 1994 | [JP] | Japan | 6-174233 |
| Jul. 12, 1995 | [JP] | Japan | 7-176036 |

[51] Int. Cl.⁶ .................................. H01L 21/205
[52] U.S. Cl. .................. 438/607; 438/661; 438/622
[58] Field of Search .......................... 437/192, 194, 437/195, 248

[56] References Cited

U.S. PATENT DOCUMENTS

| 5,187,561 | 2/1993 | Hasunuma et al. | 257/771 |
| 5,250,468 | 10/1993 | Matsuura et al. | 437/195 |
| 5,354,711 | 10/1994 | Heitzmann et al. | 437/195 |
| 5,372,971 | 12/1994 | Kang et al. | 437/195 |
| 5,409,862 | 4/1995 | Wada et al. | 437/197 |
| 5,424,246 | 6/1995 | Matsuo et al. | 437/192 |

FOREIGN PATENT DOCUMENTS

| 58-78454 | 5/1983 | Japan . |
| 61-99372 | 5/1986 | Japan . |
| 1-120035 | 5/1989 | Japan . |

OTHER PUBLICATIONS

Japanese Journal of Applied Physics, vol. 32, No. 6B, pp. 3094–3098, 1993, J. Wada, et al., "Formation of Single--Crystal Al Interconnection by In Situ Annealing".

Proc. IEEE Int. Reliability Physics Symposium, 1993, J. Wada, et al., "New Method of Making Al Single Crystal Interconnections on Amorphous Insulators", 6 pages.

*Primary Examiner*—John Niebling
*Assistant Examiner*—Kevin Turner
*Attorney, Agent, or Firm*—Oblon, Spivak, McClelland, Maier & Neustadt, P.C.

[57] ABSTRACT

The method of manufacturing a semiconductor device, according to the present invention, includes the steps of forming a polycrystal lower-level Al wiring layer on a silicon substrate, forming an interlayer insulation film for covering the lower-level Al wiring layer on the entire surface, forming a connection hole which reaches the lower-level Al wiring layer in the interlayer insulation film, forming a polycrystal upper-level Al wiring layer on a surface of the interlayer insulation film, forming an interlayer insulation film for covering the upper-level Al wiring layer on the entire surface, and forming a single-crystal lower-level Al wiring layer and upper-layer Al wiring layer which are connected to each other in the connection hole by heating the silicon substrate so that the lower-level Al wiring layer and the upper-level Al wiring layer are converted from a polycrystal phase to an amorphous phase, and then cooling the silicon substrate so that the upper-level Al wiring layer is set in a supercooling state.

11 Claims, 6 Drawing Sheets

METHOD OF MANUFACTURE OF SEMICONDUCTOR DEVICE

BACKGROUND OF THE INVENTION

1. Field of the Invention

The present invention relates to a semiconductor device having a multi-level wiring layer and a method of manufacturing a semiconductor device, including a step of forming a multi-level single-crystal wiring layer.

2. Description of the Related Art

Recently, in the main portion of a computer or a communication device, large-scale integrated circuits (LSI) in each of which a great number of transistors, resistors and the like are connected with each other to form electrical circuits, and are integrated on one chip, are frequently used. Therefore, the performance of the whole device depends greatly on the performance of each single LSI.

The achievement of the performance of a single LSI can be achieved by increasing the degree of integration, that is, the downsizing of the element. However, when an LSI is downsized, the wiring width or the thickness of its wiring layer is reduced, which results in lowering of the reliability of the wiring.

As the factors of lowering the reliability of the wiring, the electromigration phenomenon and the stressmigration phenomenon are considered. The following is an explanation of these phenomena in connection with the case of an Al wiring layer, as an example. The electromigration is a phenomenon where electrons flowing to the Al wiring layer collide with Al atoms to transfer them. In contrast, the stress migration is a phenomenon where Al atoms are transferred by a mechanical stress from other materials used in the LSI.

Wiring layers presently used are made of polycrystalline aluminum, and therefore a great number of crystal grain boundaries are present in the wiring layer. Each of the crystal grain boundaries is a collectivity of lattice defects and structurally instable, and therefore the diffusion coefficient of Al atoms in each crystal grain boundary is large.

In an electromigration in a polycrystal Al wiring, Al atoms are migrated at the same speed up to a crystal grain boundary; however the moving speed of the Al atoms is increased in the crystal grain boundary. In other words, the depletion of Al atoms occurs on the upstream side, with respect to the crystal boundary, of the Al atom flow, whereas the accumulation of Al atoms occurs on the downstream side. The depletion and accumulation of Al atoms cause the generation of disconnection and hillock, respectively.

In a stress migration in a polycrystal Al wiring, as a mechanical stress is applied to a polycrystal Al wiring layer, Al atoms start to move in the direction in which the stress is released. In the stress migration, Al atoms move easily particularly in a crystal grain boundary in the polycrystal Al wiring layer, and therefore Al atoms are depleted in the grain boundary, causing a disconnection in the polycrystal Al wiring layer.

In order to prevent the lowering of the reliability of a polycrystal Al wiring layer, it is considered that the orientation and grain size of Al in the Al wiring layer should be proposed. An Al crystal has a face-centered cubic structure, and its surface energy is smallest at (111) face. Therefore, when <111> high orientation with respect to a vertical axis of the substrate is achieved, there is a less chance for a (111) face, which has a small surface energy, to be positioned opposite to a surface which makes the wiring cross section smallest. Therefore, the slit-like disconnection due to the stress migration can be suppressed, thus improving the reliability of the Al wiring layer.

However, when an Al wiring layer is formed by a conventional sputtering method, the <111> axes of individual Al crystal grains are distributed by 10° or more. With a high orientation of this level, it is difficult to assure the reliability of the Al wiring layer.

When the diameters of individual crystal grains in the Al wiring layer are increased, the number of crystal grain boundaries can be reduced, thus making it possible to improve the property of resisting to electromigration. However, with the conventional heat treatment method, all the Al crystal grains cannot be uniformly enlarged in size, and therefore small Al crystal grains remain in its Al wiring layer. As a result, a disconnection occurs near these small-size Al crystal grains.

In order to improve the electromigration resisting property or the stress migration resisting property, it is proposed that an Al wiring layer should be single-crystalized. It is generally known that no crystal grain boundaries are present in a single-crystal wiring layer and therefore such a single-crystal wiring layer has a very high reliability.

Examples of the conventional method of forming a monocrsytal wiring layer are a method in which crystals are epitaxially grown on a single-crystal substrate and a lateral epitaxial method in which single-crystal species are grown on an amorphous insulation film. However, a wiring layer of an LSI is formed mostly on an amorphous insulation material, and is not brought into direct contact with a single-crystal material which serves as crystal species. Consequently, it is very difficult to form a single-crystal wiring layer by use of the epitaxial method in an LSI manufacture step.

Under the above-described circumstances, the inventors of the present invention proposed, as a method of forming a single-crystal wiring layer of an LSI, a new single-crystal wiring layer forming method, in which a metal thin film is formed on a wiring groove, and then the metal thin film is flocculated and separated by heating the substrate so as to fill the groove with the metal and single-crystalize the metal at the same time, thus forming a single-crystal wiring layer in the wiring groove (U.S. Pat. No. 5,409,862). With this method, a single-crystal wiring layer can be easily formed even on an amorphous insulation film. Further, it was made clear from the examination of the single-crystal wiring layer thus formed, that it has a very high reliability.

However, in the case where the above-described method proposed by the inventors of the present invention is applied to the manufacture of a multi-level single-crystal wiring layer, for example, a two-level single-crystal wiring layer, the following problem arises.

In the case where the aspect ratio (the depth of connection hole/the diameter of opening) of the connection hole which connects the lower-level single-crystal wiring layer with the upper-level single-crystal wiring layer, exceeds 1, a void is generated in the connection hole even if the upper-level single-crystal wiring layer is formed by the above-described method proposed by the same inventors.

Further, when the upper-level wiring layer is single-crystalized by heating the substrate, the lower-level wiring layer is expanded in volume, deforming the lower-level wiring layer or causing a disconnection in the layer.

As described above, the single-crystalization method of wiring was proposed by the same inventor as the method to improve the electromigration resisting property or the stress migration resisting property. However, in the case where this method is applied to a multilevel wiring layer having a lower-level wiring layer made of a polycrystal metal, an upper-level wiring layer can be single-crystalized; however the lower-level wiring layer is deformed.

Further, in both cases of the polycrsytal wiring layer and the single-crystal wiring layer, the wiring layer is thinned along with time, thus raising the wiring resistance gradually as compared to the designed value thereof.

SUMMARY OF THE INVENTION

The object of the present invention is to provide a semiconductor device having a highly reliable multi-level wiring layer, and a method of manufacturing a semiconductor device in which a highly reliable multi-level single-crystal wiring layer.

In order to achieve the above-described object, there is provided, according to the first aspect of the present invention, a method of manufacturing a semiconductor device, comprising the steps of: forming a first wiring layer made of a material of a crystal phase, on a surface of a substrate; forming a first insulation film for covering the first wiring layer, on the first wiring layer; forming a connection hole which reaches the first wiring layer in the first insulation film; forming a conductive film made of a material of a polycrystal phase, on the first insulation film; forming a second wiring layer on the first insulation film, by processing the conductive film; forming a second insulation layer for covering the second wiring layer, on the second wiring layers; removing a surface of the second insulation film until a surface of the second wiring layer is exposed; forming an opening which reaches the first wiring layer without interfering with the second wiring layer, by etching the first and second insulation films; and converting the first and second wiring layers into first and second single-crystal wiring layers which are connected to each other in the connection hole and are disconnected in the opening, by increasing a temperature of the substrate so that the material of the first wiring layer is converted from a crystal phase to an amorphous phase and the material of the second wiring layer is converted from a polycrsytal phase to an amorphous phase, and then decreasing the temperature of the substrate so that these materials are set in a supercooling state.

The substrate used above is a substrate on which desired wiring layers or members of an element (for example, a source diffusion layer or a drain diffusion layer in the case of FET) are formed, or a substrate prepared by further forming an insulation film or some other films on the just-mentioned substrate, that is, a substrate which has been treated by a necessary treatment to be processed in the wiring step (it is also the case for the semiconductor production methods according to the second to the eleventh aspects of the present invention).

Further, the second wiring layer made of a polycrystal state, should be formed on the first insulation film preferably after removing the native oxide film present on the surface of the first wiring layer at the bottom portion of the connection hole.

The temperature of the substrate should be increased or decreased preferably after removing the native oxide film present on the first wiring layer at the bottom portion of the opening and the native oxide film present on the surface of the second wiring layer. Further, it is more preferable that the temperature of the substrate should be increased or decreased after the removal of the native oxide films and while suppressing the re-formation of native oxide films.

The opening should preferably be of a size capable of holding a volume-expanding portion of the first wiring layer, which results when raising the temperature of the substrate and the wiring layer changing its state from polycrystal to amorphous.

Further, the opening should preferably located at a bent portion of the pattern of the first wiring layer.

According to the second aspect of the present invention, there is provided a method of manufacturing a semiconductor device, comprising the steps of: forming a first wiring layer made of a material of a crystal phase, on a surface of a substrate; forming an insulation film for covering the first wiring layer, on the first wiring layer; forming a connection hole which reaches the first wiring layer in the first insulation film, and a wiring groove in a surface of the insulation film; forming a conductive film made of a material of a polycrystal phase, on the insulation film; forming a second wiring layer in the connection hole and in the wiring groove by removing a portion of the conductive film other than those portions in the connection hole and the wiring groove; forming an opening which reaches the first wiring layer without interfering with the second wiring layer, by etching the insulation film; and converting the first and second wiring layers into first and second single-crystal wiring layers which are connected to each other in the connection hole and are disconnected in the opening, by increasing a temperature of the substrate so that the material of the first wiring layer is converted from a crystal phase to an amorphous phase and the material of the second wiring layer is converted from a polycrsytal phase to an amorphous phase, and then decreasing the temperature of the substrate so that these materials are set in a supercooling state.

According to the third aspect of the present invention, there is provided a method of manufacturing a semiconductor device, comprising the steps of: forming a first wiring layer made of a material of a crystal phase, on a surface of a substrate; forming an insulation film for covering the first wiring layer, on the first wiring layer; forming a connection hole which reaches the first wiring layer and an opening in the first insulation film, and a wiring groove in a surface of the insulation film; forming a conductive film made of a material of a polycrystal phase, on the insulation film; forming a second wiring layer in the connection hole, the opening and in the wiring groove by removing the conductive film except for those portions remaining in the connection hole, the opening and the wiring groove; and converting the first and second wiring layers into first and second single-crystal wiring layers which are connected to each other in the connection hole and are disconnected in the opening, by increasing a temperature of the substrate so that the material of the first wiring layer is converted from a crystal phase to an amorphous phase and the material of the second wiring layer is converted from a polycrsytal phase to an amorphous phase, and then decreasing the temperature of the substrate so that these materials are set in a supercooling state.

Further, the second wiring layer made of a polycrystal state, should be formed on the first insulation film preferably after removing the native oxide film present on the surface of the first wiring layer at the bottom portions of the connection hole and the opening.

The temperature of the substrate should be increased or decreased preferably in the state in which a native oxide film is not formed on the surface of the first wiring layer or after removing the native oxide film present on the first wiring layer at the bottom portion of the opening and the native oxide film present on the surface of the second wiring layer. Further, it is more preferable that the temperature of the substrate should be increased or decreased after the removal of the native oxide films and while suppressing the re-formation of native oxide films.

The opening should preferably be of a size capable of holding a volume-expanding portion of the first wiring layer, which results when raising the temperature of the substrate and the wiring layer changing its state from polycrystal to amorphous.

According to the fourth aspect of the present invention, there is provided a method of manufacturing a semiconductor device, comprising the steps of: forming a first wiring layer made of a material of a crystal phase, on a surface of a substrate; forming an insulation film for covering the first wiring layer, on the first wiring layer; forming a connection hole which reaches the first wiring layer and an opening in the first insulation film, and a wiring groove in a surface of the insulation film; forming a conductive film made of a material of a polycrystal phase, on the insulation film; forming a second wiring layer in the connection hole and in the wiring groove by removing a portion of the conductive film other than those portions in the connection hole and the wiring groove; and converting the first and second wiring layers into first and second single-crystal wiring layers which are connected to each other in the connection hole and are disconnected in the opening, by increasing a temperature of the substrate so that the material of the first wiring layer is converted from a crystal phase to an amorphous phase and the material of the second wiring layer is converted from a polycrsytal phase to an amorphous phase, and then decreasing the temperature of the substrate so that these materials are set in a supercooling state.

Further, the second wiring layer made of a polycrystal state, should be formed on the first insulation film preferably after removing the native oxide film present on the surface of the first wiring layer at the bottom portion of the connection hole.

The temperature of the substrate should be increased or decreased preferably in the state where a native oxide film is not yet formed on the surface of the first wiring layer or after removing the native oxide film present on the surface of the second wiring layer. Further, it is more preferable that the temperature of the substrate should be increased or decreased after the removal of the native oxide films and while suppressing the re-formation of native oxide films.

The material of a crystal phase is a material of a polycrsytal state or a single-crystal state. The material of the first wiring layer may be either one of the polycrystal and single-crystal materials; however, since the first and second wiring layers can be converted into the single-crystal state at the same time, the material should preferably be of the polycrsytal state, in terms of the reduction of the number of steps.

According to the fifth aspect of the present invention, there is provided a method of manufacturing a semiconductor device, comprising the steps of: forming a first wiring layer made of a material of a crystal phase, on a surface of a substrate; forming a first insulation film for covering the first wiring layer, on the first wiring layer; forming a connection hole which reaches the first wiring layer in the first insulation film; forming a conductive film made of a material of a polycrystal phase and having a melting point lower than that of the first wiring layer, on the first insulation film; forming a second wiring layer on the first insulation film, by processing the conductive film; forming a second insulation layer for covering the second wiring layer, on the second wiring layers; removing a surface of the second insulation film until a surface of the second wiring layer is exposed; forming an opening which reaches the first wiring layer without interfering with the second wiring layer, by etching the first and second insulation films; and converting the first wiring layer made of a single-crystal material and the second wiring layer made of a polycrystal material into first and second single-crystal wiring layers which are connected to each other in the connection hole and are disconnected in the opening, by increasing a temperature of the substrate so that the material of the second wiring layer is converted from a polycrystal phase to an amorphous phase, and then decreasing the temperature of the substrate so that the material is set in a supercooling state.

According to the sixth aspect of the present invention, there is provided a method of manufacturing a semiconductor device, comprising the steps of: forming a first wiring layer made of a material of a crystal phase, on a surface of a substrate; forming an insulation film for covering the first wiring layer, on the first wiring layer; forming a connection hole which reaches the first wiring layer in the insulation film, and a wiring groove in a surface of the insulation film; forming a conductive film made of a material of a polycrystal phase and having a melting point lower than that of the first wiring layer, on the first insulation film; forming a second wiring layer in the connection hole and the wiring groove by removing a portion of the conductive film other than those portions remaining in the connection hole and the wiring groove; and converting the first wiring layer made of a single-crystal material and the second wiring layer made of a polycrystal material into first and second single-crystal wiring layers which are connected to each other in the connection hole and are disconnected in the opening, by increasing a temperature of the substrate so that the material of the second wiring layer is converted from a polycrystal phase to an amorphous phase, and then decreasing the temperature of the substrate so that the material is set in a supercooling state.

According to the seventh aspect of the present invention, there is provided a method of manufacturing a semiconductor device, comprising the steps of: forming a first wiring layer made of a material of a crystal phase, on a surface of a substrate; forming an insulation film for covering the first wiring layer, on the first wiring layer; forming a connection hole which reaches the first wiring layer in the insulation film, and a wiring groove in a surface of the insulation film; forming a conductive film made of a material of a polycrystal phase and having a melting point lower than that of the first wiring layer, on the first insulation film; and converting the conductive film into a second wiring single-crystal wiring layer which fills the wiring groove and is connected to the first wiring in the connection hole, by increasing a temperature of the substrate so that the material of the conductive film is converted from a polycrystal phase to an amorphous phase, and then decreasing the temperature of the substrate so that the material is set in a supercooling state.

The second wiring layer made of a polycrystal state, should be formed on the first insulation film preferably after removing the native oxide film present on the surface of the first wiring layer at the bottom portion of the connection hole.

The temperature of the substrate should be increased or decreased preferably in the state where a native oxide film is formed on the surface of the first wiring layer, or after removing the native oxide film present on the surface of the second wiring layer. Further, it is more preferable that the temperature of the substrate should be increased or decreased after the removal of the native oxide films and while suppressing the re-formation of native oxide films.

It is also possible that at least one of the connection hole, the opening and the wiring groove is roughly filled with the conductive film by increasing the temperature of the substrate to a temperature lower than the melting point of the conductive film so that the conductive film is made into fluid, in the step of forming the conductive film made of a material of a polycrystal phase, on the surface of the substrate.

In the present invention, the temperature of the substrate and that of the wiring layers do not have to be always the same. More specifically, when the temperature of the substrate is increased by actively heating the substrate, the temperature of the substrate is generally higher than that of the wiring layer. However, when the temperature of the substrate is raised by actively heating the wiring layer, the temperature of the wiring layer is generally higher than that of the substrate. Thus, the temperature of the substrate is not always the same as that of the wiring layer.

According to the eighth aspect of the present invention, there is provided a method of manufacturing a semiconductor device, comprising the steps of: forming an insulation material on a surface of a substrate; forming both or either of a connection hole and a wiring groove on the insulation material; forming a metal film on the insulation material so as to make a continuous film in both or either one of inner surfaces of the connection hole and the wiring groove; filling the metal film into both or either one of the connection hole and the wiring groove by selectively heating the metal film so as to make the metal film into fluid; and forming a wiring layer by removing a portion of the metal film other than portions of both or either one of the connection hole and the wiring groove.

In order to selectively heat the metal layer, it is preferable that the induction heating method should be used. In the case where the induction heating method is used, an AC magnetic field of a higher frequency should preferably be used since the object material can be heated more effectively when an AC magnetic field of a higher frequency is used. Further, the number of windings of the induction coil should be as many as possible. Furthermore, as the material of the stage for holding the substrate, for example, such as, quarts which cannot be heated by the induction heating should preferably used.

In order to convert the wiring layer into a single-crystal state, it is preferable that the temperature of the metal should be selectively increased by high-frequency induction heating so that the metal film is converted from a polycrystal phase to an amorphous phase, and then temperature of the metal film should be decreased so that the metal film is set in a supercooling state.

According to the present invention, there is provided a semiconductor device comprising: a first wiring layer; an insulation material for covering the first wiring layer; a second wiring layer formed on the insulation material; a plug for connecting the first wiring layer and the second wiring layer with each other; and a plug connected to the first wiring layer and disconnected from other wiring layers, for supplying atoms for a thinning of the first wiring layer.

With the above-described structural members, the following effects can be achieved.

That is, according to the studies of the inventors of the present invention, it was found that a single-crystal conductive layer could be formed by a particular heat treatment, in which a conductive film made of a material in a polycrystal phase is formed on a substrate, and then the substrate is heated so that the material of this conductive film is converted from a polycrystal state to an amorphous state, which is followed by the cooling of the substrate, carried out so as to set the material in a supercooling state.

With the above discovery, according to the present invention, not only after the formation of the first and second wiring layers made of a single-crystal material, but also after the formation of the first and second polycrystal wiring layers, the first and second single-crystal wiring layers made of a single-crystal material can be formed by subjecting the polycrystal wiring layers to the above particular heat treatment.

A single-crystal wiring layer has an excellent electromigration resistance and an excellent stress migration resistance, and therefore according to the present invention, a highly reliable multi-level wiring layer can be obtained.

Further, according to the present invention, even in the case where a polycrystal wiring layer (the second wiring) is formed after the formation of a single-crystal wiring layer (the first wiring), the single-crystalization of the first wiring is not disturbed when the second wiring is single-crystalized by the particular heat treatment since the melting point of the second wiring is lower than that of the first wiring.

Therefore, a highly reliable multi-level wiring layer having an excellent electromigration resistance and an excellent stress migration resistance, can be obtained.

Further, according to the present invention, the metal portion can be selectively heated, and the material other than the metal portion can be maintained at a low temperature. Therefore, even in the case where a connection hole having a high aspect ratio is filled with a metal film made into a fluid, the diffusion of impurities at connection portion, or the diffusion of metal to the semiconductor or the insulation material can be suppressed.

Furthermore, according to the present invention, a plug (dummy plug) which is not connected to another wiring layer, should be provided at a predetermined position of a multi-level wiring structure. Thus, even if the transfer of atoms occurs, atoms can be supplied from the plug, and therefore the thinning of the wiring portion can be prevented. Further, this structure serves as a source of supplying atoms which are transferred in a crystal grain boundary, also for a polycrystal wiring layer. Consequently, the time period for a disconnection to occur due to the electromigration can be prolonged, thus making it possible to improve the reliability.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which.

DETAILED DESCRIPTION OF THE PREFERRED EMBODIMENTS

Embodiments of the present invention will now be described with reference to accompanying embodiments.

(The First Embodiment)

FIG. 1A to 1E are cross sections illustrating the method of manufacturing a multi-level single-crystal wiring layer according to the first embodiment of the present invention.

Figure 1A:
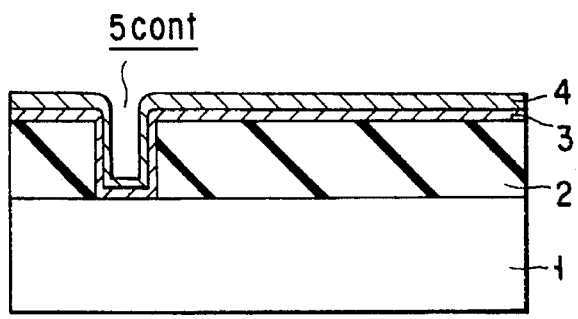
FIGS. 1A to 1E are cross sections illustrating the method of manufacturing a multi-level single-crystal wiring layer according to the first embodiment of the present invention.

As shown in FIG. 1A, a BPSG film 2 having a thickness of 0.8 μm is formed on a single-crystal silicon substrate 1 by the atmospheric pressure CVD method. Next, a resist pattern (not shown) for forming a connection hole is formed on the BPSG film 2, and the BPSG film 2 is etched by the reaction ion etching method (RIE method) with use of this resist pattern as a mask, thus a connection hole 5cont is made in the section of the BPSG film 2, which corresponds to a wiring layer or an element activation layer (not shown). Next, the resist pattern is removed, and a Ti film 3 having a thickness of 20 nm and a TiN film 4 having a thickness of 70 nm serving as a barrier metal, which make a lamination film, are formed by the DC magnetron sputtering method. After that, the single-crystal silicon substrate 1 is subjected to a heat treatment carried out in an $N_2$ atmosphere at 600° C. and atmospheric pressure for 30 minutes.

Figure 1B:
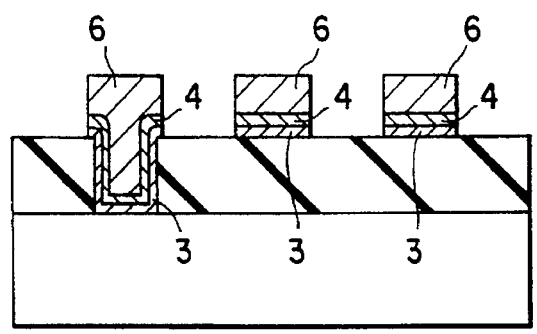

Then, as shown in FIG. 1B, a pure Al film having a thickness of 0.4 μm, which serves as a lower-level Al wiring layer 6, is formed by the DC magnetron sputtering method. Next, a resist pattern (not shown) for forming the lower-level Al wiring layer is formed on the pure Al film. With use of this resist pattern as a mask, the pure Al film, the TiN film 4 and the Ti film 3 are etched by the RIE, thus forming the lower-level Al wiring layer 6. The lower-level Al wiring layer 6 thus formed is a polycrystal Al wiring layer. After that, the resist pattern is removed.

Figure 1C:
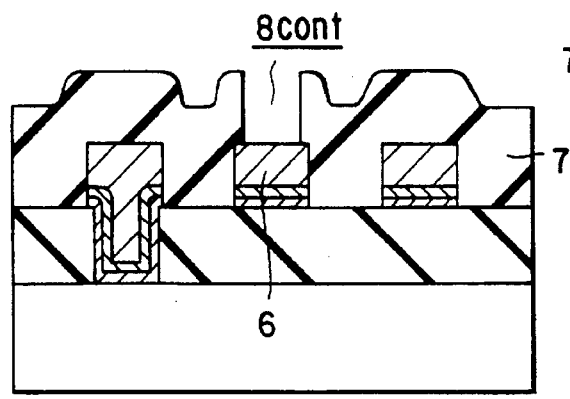

Next, as shown in FIG. 1C, an $SiO_2$ film 7 having a thickness of 0.8 μm, serving as a first interlayer insulation film, is formed on the entire surface by the plasma CVD method using a mixture gas of TEOS and $O_2$, and then a resist pattern (not shown) for forming a connection hole is formed. Next, with use of this resist pattern as a mask, the $SiO_2$ film 7 is etched to a degree wherein the upper surface of the predetermined portion of the lower-level Al wiring layer 6 is exposed, thus making a connection hole 8cont.

Next, the resist pattern is removed, the silicon substrate 1 is introduced into a vacuum chamber, and by the irradiation of $Ar^+$ ions in the vacuum atmosphere, the native oxide film on the bottom surface of the connection hole 8cont is removed.

Figure 1D:
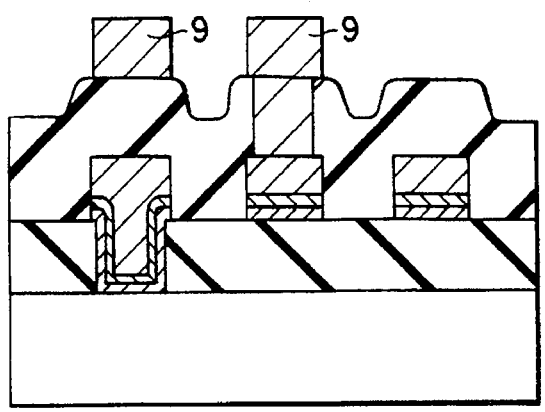

Next, as shown in FIG. 1D, an upper-level pure Al film having a thickness of 0.8 μm is formed on the entire surface by the DC magnetron sputtering method without disturbing the vacuum atmosphere. Then, a resist pattern for forming an upper-level Al wiring layer is formed thereon. With use of this resist pattern as a mask, the upper-level pure Al film is etched by the RIE, thus forming an upper-level Al wiring film 9. The upper-level Al wiring layer 9 thus formed is a polycrystal Al wiring layer. After that, the resist pattern is removed.

Figure 1E:
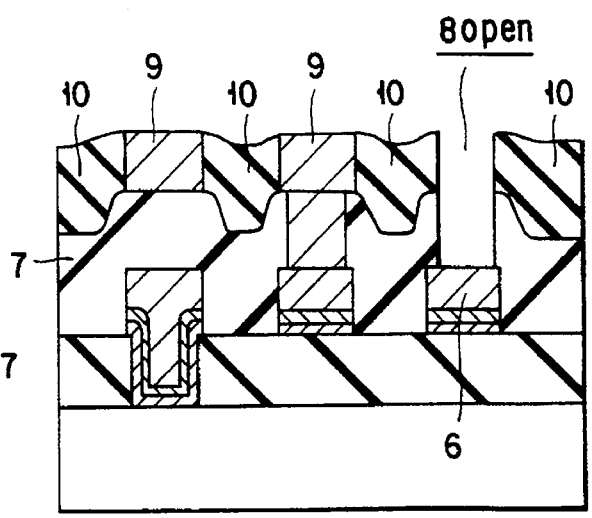

Next, as shown in FIG. 1E, an $SiO_2$ film 10 having a thickness of 0.8 μm, serving as a second interlayer insulation film, is formed on the entire surface by the plasma CVD method using a mixture gas of TEOS and $O_2$, and then, with use of the chemical mechanical polishing (CMP) method, the surface of the $SiO_2$ film 10 is etched to a degree wherein the upper surface of the predetermined portion of the upper-level Al wiring layer 9 is exposed.

Next, the $SiO_2$ films 7 and 10 on the lower-level Al wiring layer 6 which is not in contact with the upper-level Al wiring layer 9 are selectively etched with use of the photolithography method and the RIE method, thus making an opening 8open to expose the lower-level Al wiring layer 6.

Next, the silicon substrate 1 is introduced into a vacuum chamber, and by the irradiation of $Ar^+$ ions in the vacuum atmosphere, the native oxide film located on the upper surface of the upper-level Al wiring layer 9 is removed. Then, the silicon substrate 1 is heated up to 670° C. without disturbing the vacuum atmosphere, that is, while suppressing the re-formation of a native oxide film, so as to melt the lower-level Al wiring layer 6 and the upper-level Al wiring layer 9. Subsequently, the silicon substrate is cooled at a temperature decreasing (cooling) rate of 120° C./minute, for example, so as to convert the lower-level and upper-level Al wiring layers 6 and 9 from polycrystal Al wiring layers to single-crystal Al wiring layers.

With this heat treatment, the lower-level Al wiring layer which is not in contact with the upper-level Al wiring layer, expends in volume; however, the lower-level Al wiring layer is single-crystalized without being deformed or disconnected, since the opening is made above the lower-level Al wiring layer.

The above heat temperature (670° C.) is a temperature which is slightly higher than the melting point of pure Al, and with this temperature, the crystal phase of Al changes from a polycrystal state to an amorphous state. When the silicon substrate 1 is cooled at the above-mentioned cooling rate (120° C./min), Al can be kept in a liquid state, in other words, a supercooling state in which an amorphous state is maintained, even if the temperature becomes lower than the melting point. Further, the crystal growth rate is proportional to the square of this supercooling degree (the difference between the temperature of the supercooling state and the melting point), and as the supercooling degree becomes larger, the crystal growth speed becomes higher. In order to obtain a single-crystal wiring layer having a length sufficient for a wiring of an LSI, the supercooling degree should preferably be 1K (1 degree) or more.

As described above, according to this embodiment, after the silicon substrate 1 is heated to achieve the transition of Al from the polycrystal state to the amorphous state, the silicon substrate 1 is cooled to achieve the supercooling state of Al. Thus, a sure connection can be obtained in the connection hole 8cont, and the single-crystal lower-level Al wiring layer 6 and upper-level Al wiring layer 9 can be formed. Therefore, a highly reliable multi-level single-crystal Al wiring layer having an excellent electromigration resisting property and an excellent stress migration resisting property, can be achieved.

(The Second Embodiment)

FIGS. 2A–2D are cross sections showing a method of forming a multi-level single-crystal wiring layer according to the second embodiment of the present invention.

Figure 2A:
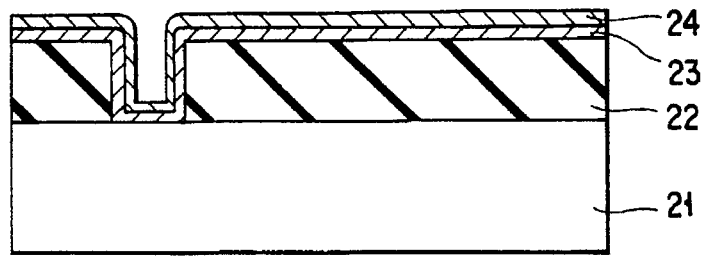
FIGS. 2A to 2D are cross sections illustrating the method of manufacturing a multi-level single-crystal wiring layer according to the second embodiment of the present invention.

First, as shown in FIG. 2A, a BPSG film 22 having a thickness of 0.8 μm is formed on a single-crystal silicon substrate 21 by the atmospheric pressure CVD method. Next, a resist pattern (not shown) for forming a connection hole is formed on the BPSG film 22, and the BPSG film 22 is etched by the RIE method with use of this resist pattern as a mask, thus making a connection hole in the section of the BPSG film 2, which corresponds to a wiring layer or an element activation layer (not shown). Next, the resist pattern is removed, and a Ti film 23 having a thickness of 20 nm and a TiN film 24 having a thickness of 70 nm serving as a barrier metal, which make a lamination film, are formed by the DC magnetron sputtering method. After that, the single-crystal silicon substrate 21 is subjected to a heat treatment carried out in an $N_2$ atmosphere at 600° C. and atmospheric pressure for 30 minutes.

Figure 2B:
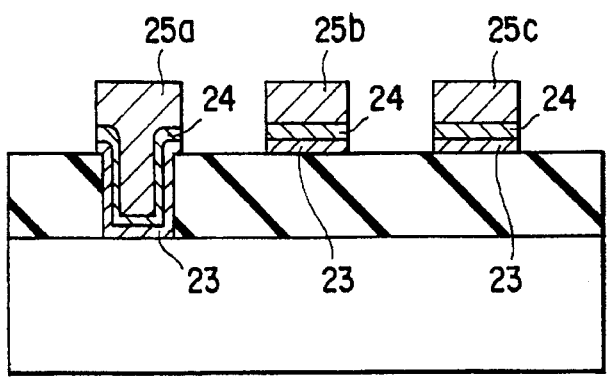

Then, as shown in FIG. 2B, a lower-level pure Al film having a thickness of 0.4 μm, which is to make lower-level Al wiring layers 25a–25c, is formed by the DC magnetron sputtering method. Next, a resist pattern (not shown) for forming the lower-level Al wiring layer is formed on the lower-level pure Al film. With use of this resist pattern as a mask, the pure Al film, the TiN film 24 and the Ti film 23 are etched by the RIE, thus forming the lower-level Al wiring layers 25a to 25c. The lower-level Al wiring layers 25a–25c thus formed are polycrystal Al wiring layers. After that, the resist pattern is removed.

Figure 2C:
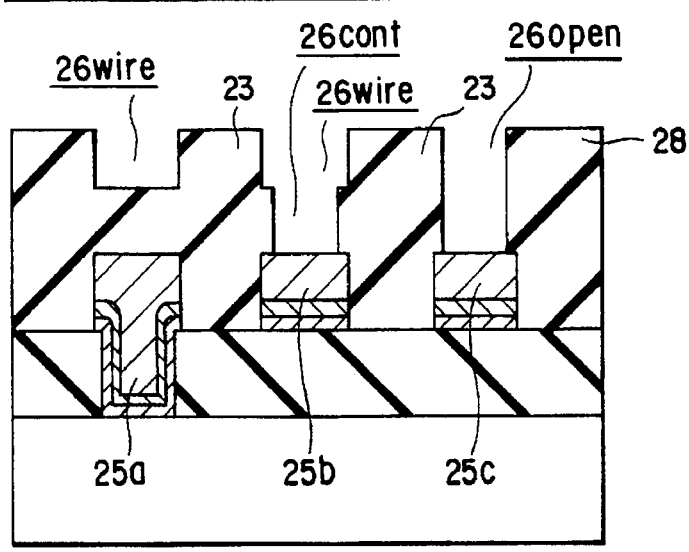

Next, as shown in FIG. 2C, an $SiO_2$ film 28 having a thickness of 1.2 μm, serving as a first interlayer insulation film, is formed on the entire surface by the plasma CVD method using a mixture gas of TEOS and $O_2$, and then the surface of the $SiO_2$ film 28 is smoothed by the CMP method. Next, with use of the photolithography method and the RIE method, the $SiO_2$ film 28 is etched so that the upper surface of the lower-level Al wiring layer 25b is exposed, thus making a connection hole 26cont. In a similar manner, the $SiO_2$ film 28 is etched so as to make an opening 26open for holding a volume-expanded portion of the lower-level Al wiring layer 25c, which results in the heating step conducted later.

Next, the resist pattern used in the etching is removed, and then, wiring grooves 26wire each having a depth of 0.4 μm are formed above the lower-level Al wiring layers 25a and 25b, for holding upper-level Al wiring layers which are formed by etching the $SiO_2$ film 28 in a later step by using the photolithography method and the RIE method. After the resist pattern used for forming the wiring grooves 26wire is removed, the silicon substrate 21 is introduced into a vacuum chamber, and by the irradiation of $Ar^+$ ions in the vacuum atmosphere, the native oxide films on the bottom surfaces of the connection hole 26cont and the opening 26open are removed.

Next, an upper-level pure Al film having a thickness of 0.4 μm, which is to be made into upper-level Al wiring layers 27a and 27b, is formed the DC magnetron sputtering method without disturbing the vacuum atmosphere. The upper-level pure Al film thus formed is a polycrystal Al film.

Then, the silicon substrate 21 is heated up to 670° C. without disturbing the vacuum atmosphere, so as to flocculate/separate the upper-layer pure Al film. Thus, the upper-level pure Al film is filled in the wiring grooves 26wire and the connection hole 26cont, thus forming upper-level Al wiring layers 27a and 27b. Subsequently, the silicon substrate 21 is cooled at a temperature decreasing (cooling) rate of 10°–500° C./minute, for example, so as to convert the lower-level Al wiring layers 25a to 25c and the upper-level Al wiring layers 27a and 27b from polycrystal Al wiring layers to single-crystal Al wiring layers. With this heat treatment, the single-crystal lower-level Al wiring layer 25b and the upper-level Al wiring layer 27b are surely connected to each other in the connection hole 26cont.

Figure 2D:
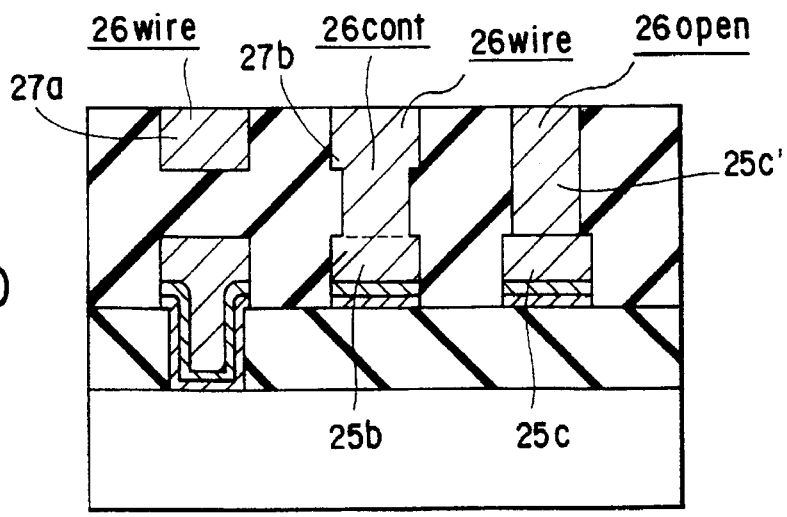

Lastly, as shown in FIG. 2D, the Al film portion remaining on the flat portion where no wiring grooves 26wire or opening 26opn are made, is removed by the CMP method, thus completing a single-crystal Al wiring layer of the multi-level structure.

Figure 3A:
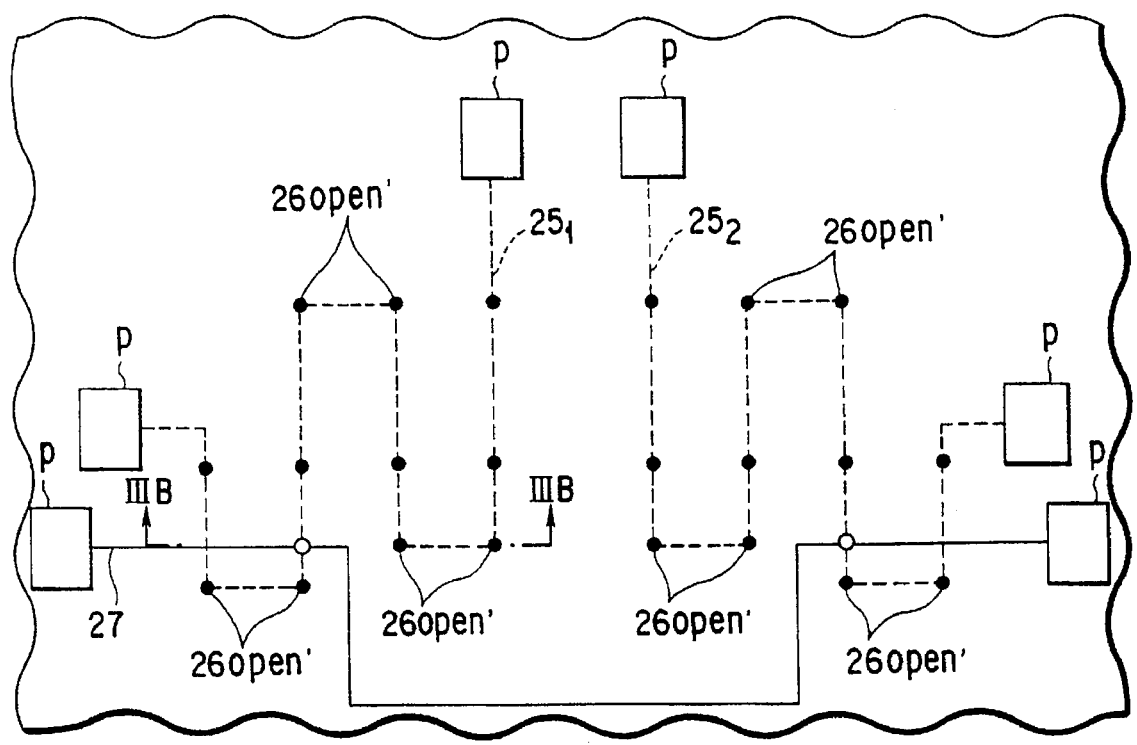
FIGS. 3A and 3B are diagrams showing an arrangement pattern of an opening hole and a connection hole formed in the multi-level single-crystal wiring layer according to the second embodiment.
Figure 3B:
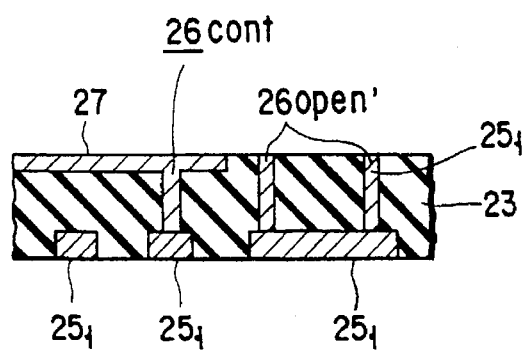

The opening 26open for holding a volume expanding portion 25c' of the lower-level Al wiring layer 25c, which results in the heating step, should preferably be located at the bent portion in the lower-level Al wiring pattern. The following is an explanation thereof with reference to FIGS. 3A and 3B. FIGS. 3A and 3B show a plan view of the wiring pattern and a cross section taken along the line between IIIB and IIIB of the plan view.

In this figure, the reference numeral $25_1$ denotes a first lower-level wiring layer, $25_1'$ denotes a volume-expansion portion of the first lower-level wiring layer $25_1$, $25_2$ denotes a second lower-level wiring layer, 27 denotes an upper-level wiring layer, a reference letter p denotes an electrode pad, a reference symbol, a black dot, denotes an opening 26open (26open'), and a white dot denotes a connection hole 26cont.

The opening holes 26open' indicate those provided at the bent portions of the lower-level Al wiring layers $25_1$ and $25_2$. Such bent portions easily receive a stress from the insulation films provided around these bent portions, and a stress concentration is likely to occur at these portions.

Therefore, if the lower-level wiring layers are expanded in these portions, the adhesion between the lower-level wiring layers and the insulation films therearound is deteriorated, or the lower-level wiring layers, in some cases, break through the insulation films, thus causing a short-circuit with other wiring.

In order to solve such a problem, an opening is intentionally provided in a bent portion so as to hold the expanded portion of the lower-level wiring layer within the opening. With this structure, the problem of a weak adhesion or short-circuit can be effectively solved.

Further, the interval between the openings provided on the straight line portion of the first and second lower-level wiring layers $25_1$ and $25_2$ is set at, for example, 10 μm. Further, the openings made on the straight portions of the first and second lower-level wiring portions $25_1$ and $25_2$ should preferably made at a constant interval.

In similar to the first embodiment, the silicon substrate 21 is heated to change the phase of Al from polycrystal to amorphous, and then the substrate 21 is cooled to achieve a supercooling state of Al. Therefore, this embodiment can provide a highly reliable multi-level Al wiring layer having an excellent electromigration resisting property and an excellent stress migration resisting property.

It should be noted that in this embodiment, all of the connection holes, the wiring grooves and the openings are formed prior to the formation of the upper-level wiring layer; however, it is also possible that the connection holes and the wiring layers are made prior to the formation of the upper-level wiring layer and the openings are made posterior to the formation thereof.

More specifically, first, in the step shown in FIG. 2C, the connection hole 26cont and the wiring grooves 26wire are formed as described above, and then, as in the step shown in FIG. 2D, the upper-level Al wiring layers 27a and 27b are formed. Subsequently, the $SiO_2$ film is etched so as to form the opening 26open. After that, the single-crystalization of the wiring is carried out as described above.

Further, in this embodiment, the upper-level wiring layers are filled by the flocculation and separation; however it is also possible that a conductive film which serves as the upper-level wiring layer, is deposited on the entire surface, and the other portion of the conductive film than those corresponding to the connection holes, wiring grooves and openings, is completely removed by etching, thus filling the upper-level wiring layer.

More specifically, in the step shown in FIG. 2D, the upper-level pure Al film which serves as the upper-level Al wiring layers 27a and 27b, is deposited on the entire surface, and then the other portion of the upper-level pure Al film than those corresponding to the wiring grooves 26wire, the connection holes 26cont and the opening 26open, is completely removed by etching.

The multi-level wiring structure described in the first and second embodiments, which have openings for holding expended portions of the lower-level wiring layers, exhibit the above-described effect in terms of structure.

In the meantime, it is generally the case that when a current is applied to a polycrystal wiring layer, electrons collide with atoms of the material of the layer, and therefore the electromigration phenomenon, in which atoms are transferred from a cathode to an anode, is observed. In a polycrystal wiring layer, there are great number of crystal grain boundaries, where the atom flow rate is irregular, and therefore a disconnection occurs near a crystal grain boundary in a relatively short period of time. In a single-crystal wiring layer, the electromigration phenomenon occurs; however the time period for a disconnection to occur can be prolonged due to the absence of crystal grain boundaries, making it possible to achieve a high reliability. Nevertheless, the transfer of atoms happens, and therefore the wiring layer is thinned along with time elapse, thus gradually raising the wiring resistance as compared to the designed value.

In this case, a plug (dummy plug) which is not connected to another wiring layer, should be provided at a predetermined position of the above-described multi-level wiring structure. Thus, even if the transfer of atoms occurs, atoms can be supplied from the plug, and therefore the thinning of the wiring portion can be prevented. Further, this structure serves as a source of supplying atoms which are transferred in a crystal grain boundary, also for a polycrystal wiring layer. Consequently, the time period for a disconnection to occur due to the electromigration can be prolonged, thus making it possible to improve the reliability.

(The Third Embodiment)

FIG. 4A to 4D are cross sections illustrating the method of manufacturing a multi-level single-crystal wiring layer according to the third embodiment of the present invention.

Figure 4A:
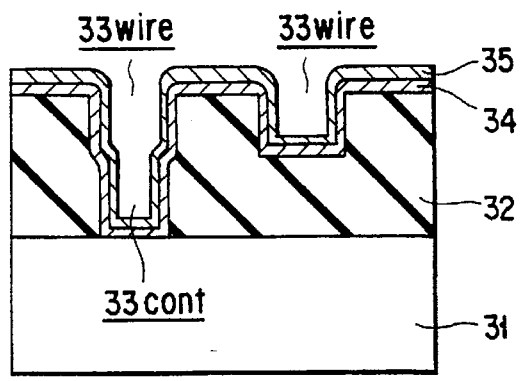
FIGS. 4A to 4D are cross sections illustrating the method of manufacturing a multi-level single-crystal wiring layer according to the fourth embodiment of the present invention.
Figure 4B:
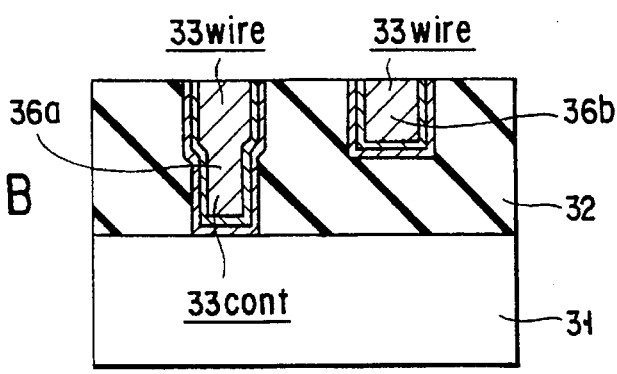

As shown in FIG. 4A, a BPSG film 32 having a thickness of 1.2 μm is formed on a single-crystal silicon substrate 31 by the atmospheric pressure CVD method. Next, a resist pattern (not shown) for forming a connection hole is formed on the BPSG film 32, and the BPSG film 32 is etched by the RIE method with use of this resist pattern as a mask, thus a connection hole 33cont is made in the section of the BPSG film 2, which corresponds to a wiring layer or an element activation layer (not shown). Next, the resist pattern is removed, and wiring grooves 33wire each having a depth of 0.4 μm for holding the first wiring layer in the BPSG film 32, are formed. After that, a Ti film 34 having a thickness of 20 nm and a TiN film 35 having a thickness of 70 nm serving as a barrier metal, which make a lamination film, are formed on the entire surface by the DC magnetron sputtering method. Then, the single-crystal silicon substrate 31 is subjected to a heat treatment carried out in an $N_2$ atmosphere at 600° C. and atmospheric pressure for 30 minutes.

Next, the silicon substrate 31 is introduced into a vacuum chamber, and a lower-level pure Al film having a thickness of 0.4 μm is formed in the vacuum atmosphere by the DC magnetron sputtering method. The lower-level pure Al film thus formed is a polycrystal Al film.

Then, the silicon substrate 31 is heated up to 670° C. without disturbing the vacuum atmosphere, so as to flocculate/separate the lower-layer pure Al film. Thus, the lower-level pure Al film is filled in the wiring grooves 33wire and the connection hole 33cont, thus forming lower-level Al wiring layers 36a and 36b. Subsequently, the silicon substrate 31 is cooled at a temperature decreasing (cooling) rate of 10°–500° C./minute, for example, so as to convert the lower-level Al wiring layers 36a and 36b from polycrystal Al wiring layers to single-crystal Al wiring layers.

Figure 4C:
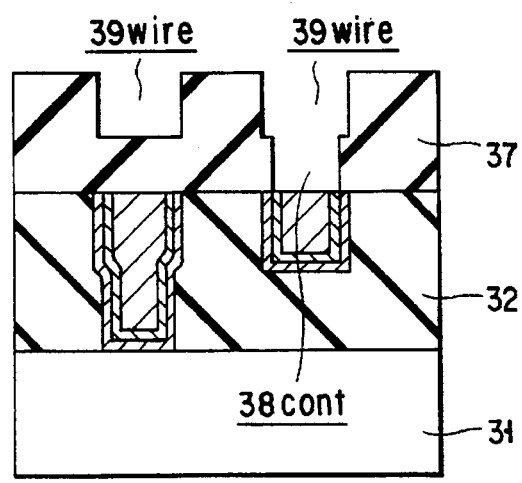
Figure 4D:
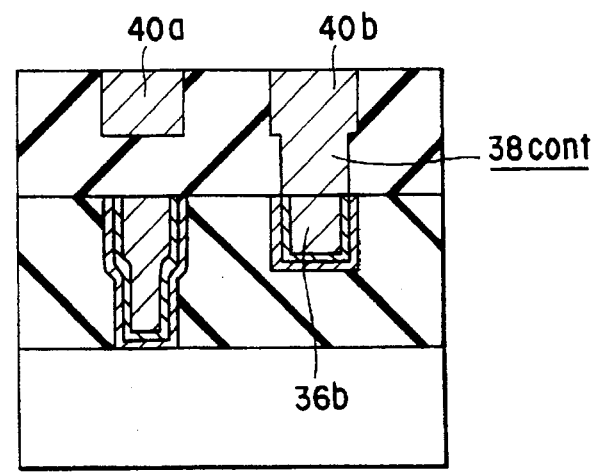

After that, as shown in FIG. 4D, the Al film portion and the TiN/Ti laminated film portion remaining on the flat portion where no wiring grooves 33wire or connection hole 33cont are made, is removed by the CMP method, thus completing a single-crystal lower-level Al wiring layers $36_a$ and $36_b$.

Next, an $SiO_2$ film 37 having a thickness of 1.2 μm, serving as an interlayer insulation film, is formed on the entire surface by the plasma CVD method using a mixture gas of TEOS and $O_2$, and then a resist pattern for forming a connecting hole is formed on the $SiO_2$ film 37. With use of the resist pattern as a mask, the $SiO_2$ film 28 is etched by the RIE so that the upper surfaces of the lower-level Al wiring layers 36a and 36b are exposed, thus making a connection hole 38cont.

Next, as shown in FIG. 4C, after the resist pattern is removed, wiring grooves 39wire each having a depth of 0.4 μm for holding the upper-level Al wiring layers are formed in the surface portion of the $SiO_2$ film 37 by the same method as of the connection hole 38cont. Then, the silicon substrate 31 is introduced into a vacuum chamber, and by the irradiation of $Ar^+$ ions in the vacuum atmosphere, the native oxide films on the bottom surfaces of the connection hole 38cont and the grooves 39wire are removed.

Next, an $Al-Si_{2\ wt\ \%}$ film having a thickness of 0.4 μm, which is to be made into upper-level AlSi alloy wiring layers 40a and 40b, is formed the DC magnetron sputtering method without disturbing the vacuum atmosphere. Thus, a conductive film which is to serve as an upper-level wiring layer made of an Al alloy having a melting point lower than that of Al, which is the material of the lower-level wiring film.

Next, the silicon substrate 31 is heated up to 500° C. without disturbing the vacuum atmosphere. With this reflow method, the $Al-Si_{2\ wt\ \%}$ film is roughly filled in the connection hole 38cont and the wiring grooves 39wire. After that, the silicon substrate 31 is further heated to 600° C. so as to melt the Al-Si$_{2\ wt\ \%}$ film and fill the connection hole 38cont and the wiring grooves 39wire completely with the Al-Si$_{2\ wt\ \%}$ film, thus forming upper-level AlSi alloy wiring layers 40a and 40b. The upper-level AlSi alloy wiring layers 40a and 40b thus formed are polycrystal AlSi alloy wiring layers.

Subsequently, the silicon substrate 31 is cooled at a temperature decreasing (cooling) rate of 10°–500° C./minute, for example, so as to convert the upper-level AlSi alloy wiring layers 40a and 40b from polycrystal to single-crystal AlSi alloy wiring layers. With this treatment, the single-crystal lower-level Al wiring layer 36b and the upper-level Al wiring layer 37b are surely connected to each other in the connection hole 38cont.

Lastly, as shown in FIG. 4D, the Al film portion remaining on the flat portion where no connection hole 38cont or wiring grooves 39wire are made, is removed by the CMP method, thus completing a single-crystal Al wiring layer of the two-level structure.

In this embodiment, the silicon substrate 31 is heated up to a temperature with which the phase of Al changes from polycrystal to amorphous, and then the substrate 21 is cooled to a temperature with which a supercooling state of Al can be achieved. Therefore, this embodiment can provide a highly reliable multi-level Al wiring layer having an excellent electromigration resisting property and an excellent stress migration resisting property.

Further, in this embodiment, the wiring material is filled by two-step heating process by the reflow method, wherein the Al-Si$_{2\ wt\ \%}$ film is roughly filled in the connection hole 38cont and the wiring grooves 39wire, and after that, the silicon substrate 31 is further heated to 600° C. so as to melt the Al-Si$_{2\ wt\ \%}$ film and fill the connection hole 38cont and the wiring grooves 39wire completely with the Al-Si$_{2\ wt\ \%}$ film. Consequently, even if the aspect ratio (depth of connection hole/diameter of opening) of the connection hole 38cont or the like, is large, for example, 1 or higher, the Al-Si$_{wt\ \%}$ film can be completely filled into the connection hole 38cont and the like.

In this embodiment, the filling of the upper-level wiring layers is carried out through the flocculation/separation; however as in the remodeled version of the second embodiment, it is also possible, for the filling of the upper-level wiring layers, that a conductive film, which is to serve as an upper-level wiring layer, is deposited on the entire surface, and the entire portion of the conductive film other than those sections in the connection hole and the wiring grooves is removed by etching.

(The Fourth Embodiment)

In this embodiment, a method of connecting upper-level and lower-level wiring layers surely with each other, and single-crystalizing the wiring layers even in the case where the aspect ratio of the connection hole connecting these wiring layers, will be described. FIGS. 5A to 5E are cross sections illustrating the method of forming a multi-level single-crystal wiring layer according to the fourth embodiment of the present invention.

Figure 5A:
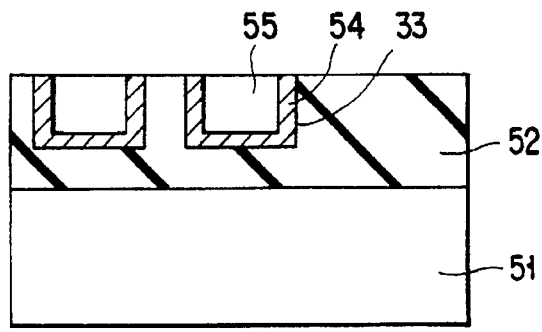
FIGS. 5A to 5E are cross sections illustrating the method of manufacturing a multi-level single-crystal wiring layer according to the fourth embodiment of the present invention.

First, as shown in FIG. 5A, a first wiring groove 53 is formed in a single-crystal silicon substrate (not shown) on which an active element, a memory element and the like are formed. Then, a barrier metal film 54 such as a TiN film, is formed on the entire surface of the substrate, and a metal film having a low specific resistance, such as Al film or Cu film, is formed to be filled in the first wiring groove 53. After that, the portion of the metal film other than the section in the wiring groove and the barrier metal film 54 are removed by the etch back method or the CMP method, thus forming a first wiring layer (metal wiring layer) 55.

Figure 5B:
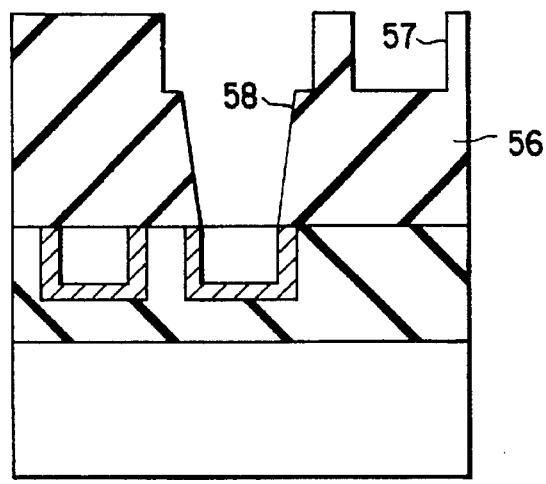

Next, as shown in FIG. 5B, a second insulation film 56 is formed, and the second insulation film 56 is etched by the photolithography method and the RIE method so as to form a second wiring groove 57 serving for holding a second wiring layer (later explained). Further, with the photolithography method of the RIE method, a connection hole 58 for connecting a first wiring 55 and having a aspect ratio of 1 or more, is formed.

Figure 5C:
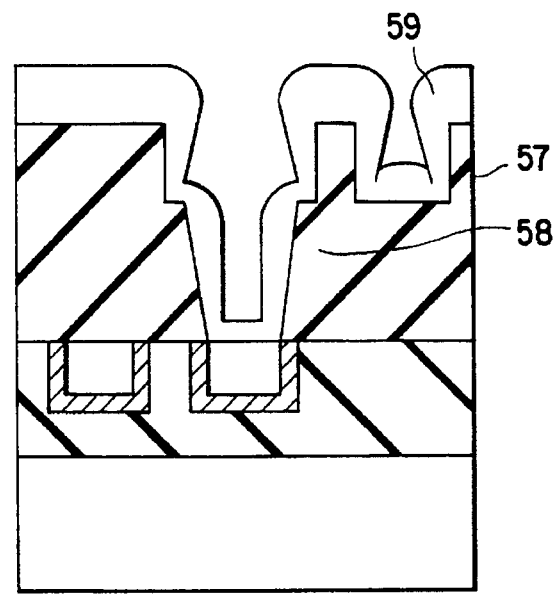

Next, as shown in FIG. 5C, a metal film 59 is formed on the entire surface so that the metal film 59 is continuously formed on the second wiring groove 57 and on the inner surface of the connection hole. In order to continuously form the metal film on the second wiring groove 57 and on the inner surface of the connection hole 58, it suffices if a tapered portion which expands towards the second wiring groove 57 and the opening of the connection hole 58 is formed, and then the metal film 59 is formed by using the different directional sputtering method, or some other method such as the CVD method.

Figure 5D:
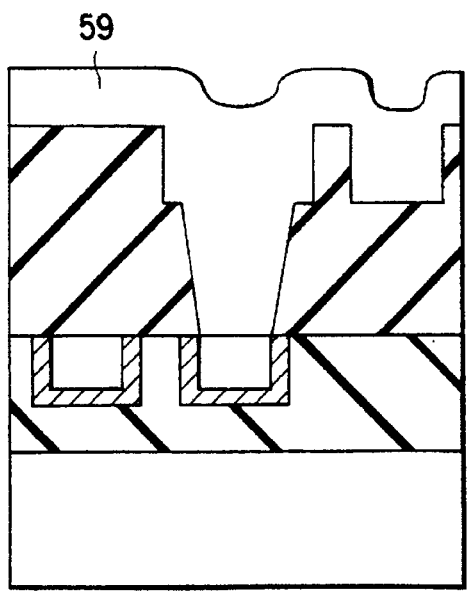

Next, as shown in FIG. 5D, the substrate is placed in an induction heater, in which the metal film 59 having a low specific resistance such as Al or Cu is selectively heated by the first high-frequency induction heating, and the metal film 59 is filled in the wiring grooves and the connection hole having a high aspect ratio in the form of fluid. At the same time, in order to avoid the formation of a native oxide film on the surface of the metal film 59, the heating of the metal film 59 should preferably be continuously carried out in the vacuum state after the formation of the film, or the heating should preferably be carried out after removing the formed native oxide film.

Figure 5E:
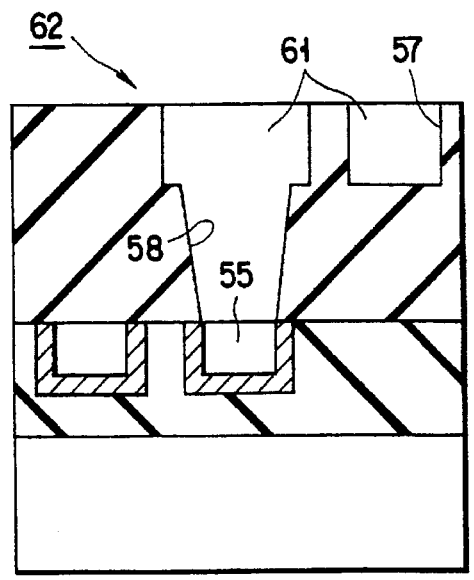

Then, as shown in FIG. 5E, the portion of the metal film other than the sections in the second wiring groove 57 and the connection hole 58, is removed by use of the etch back method or the CMP method, thus completing a second wiring layer 61 connected to the first wiring layer 55.

After that, the substrate 62 is placed in the induction heater, in which the metal of the first wiring layer 55, the second wiring layer 61 and the connection portion changes its phase to single-crystal due to the second high-frequency induction heating, thus completing a multi-level single-crystal wiring layer.

In this embodiment, the high-frequency heating method is used as a heating method; however the high-frequency heating is divided into a dielectric heating method and an induction heating method. The dielectric heating method is used for heating an insulation material or a semiconductor material, which does not contain so many free electrons. An insulation material or a semiconductor material does not contain so many free electrons, but has many positive-negative equivalent dipoles at both sides of each molecule, which do not change their average positions but change their axial direction as an electric field applied from the outside is varied. Therefore, in the case where a high-frequency AC electric field is applied from outside, the dipoles change their axial direction, creating a friction between them. As a result, the generation of heat occurs.

On the other hand, the induction heating method is used for heating a metal which contains a great number of free electrons. When a magnetic field is applied from outside to such a metal, a current is created due to the electromagnetic induction. In the case where such a magnetic field is of an AC type having a high frequency, an eddy current is created on the surface of the metal, thus generating Joule's heat.

With this method, a semiconductor such as Si or an insulation material such as $SiO_2$ cannot be heated since these materials contains a few free electrons.

Figure 6A:
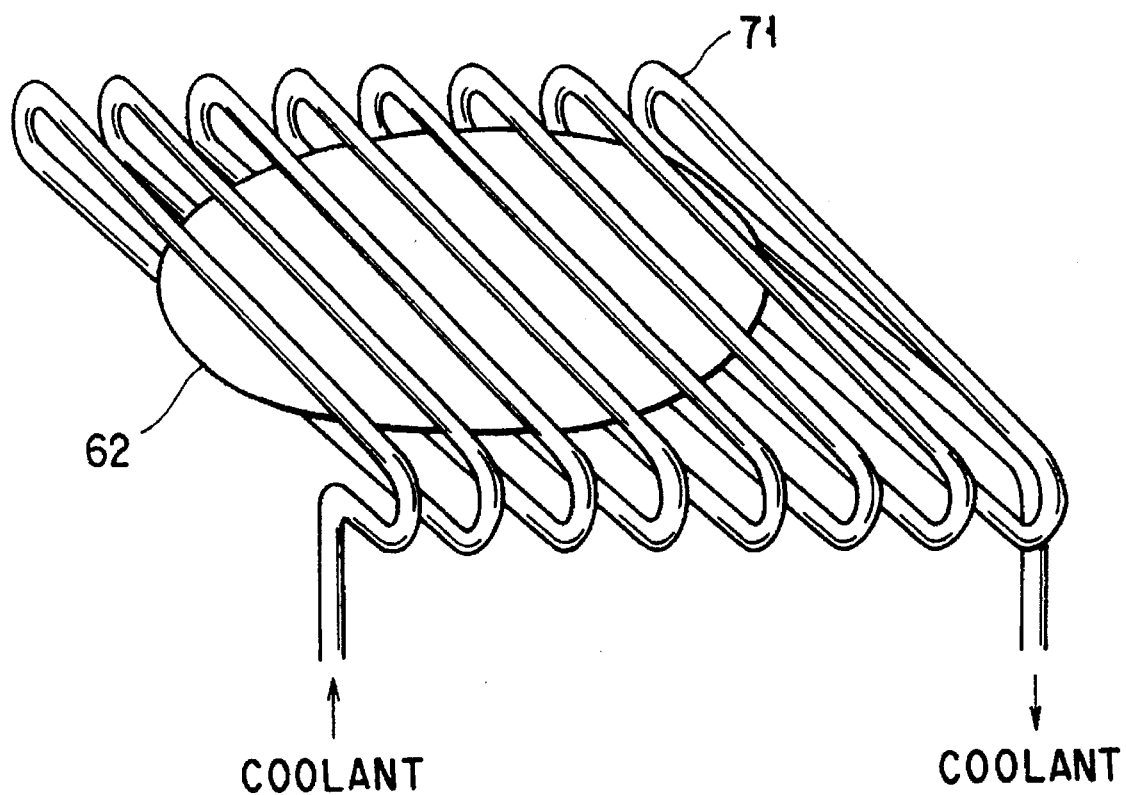
FIGS. 6A and 6B are diagrams illustrating the substrate heated by the dielectric heating method while manufacturing a multilayer single-crystal wiring layer according to the fourth embodiment.
Figure 6B:
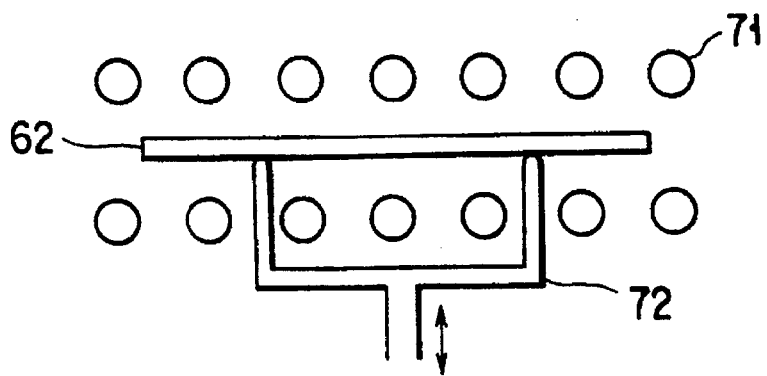

In the present invention, only the metal portion which serves as a wiring layer, is selectively heated, and therefore the induction heating method such as shown in FIG. 6 should preferably used. In this case, as shown in the perspective view of FIG. 6A, an AC current is applied to the substrate in the state where the substrate 62 is surrounded by a heating coil (induction coil) 71, which is called an inductor. It should be noted that the structure in which cooling water is allowed to flow in the induction coil 71 as shown in this figure. Further, as shown in the lateral cross section of FIG. 6B, a stage 72 for holding a substrate is provided.

In the above induction heating method, an object material can be heated at a higher efficiency as the frequency of the AC magnetic field is higher. The number of windings of the induction coil 71 should be as many as possible. Further, in order to avoid the heat conduction from the stage for holding the substrate, the material of the stage 72 should be of a type which cannot be heated by the induction heating, for example, quartz.

In the induction heating method, the heating can be carried out at a higher efficiency as the magnetic permeability of the object is higher. Al, Cu and the like, which are used in this embodiment have a magnetic permeability of 1, which is the same as that of atmosphere, and therefore each of them does not exhibit a good heating efficiency. However, the other materials such as Si or $SiO_2$ used in an LSI have the same magnetic permeability as that of the atmosphere, and have the properties in which they can be heated as selectively as metals such as Al and Cu, which have low specific resistances.

The main feature of this embodiment is that the metal film is made into a fluid by the first induction heating, so as to fill a connection hole of a high aspect ratio with the fluid. The heating of metal which is carried out through the induction heating as in this embodiment, causes the transfer of metal atoms due to collision between electrons, that is, an electromigration, since the heat is the Joule's heat generated by an eddy current. Therefore, the reflow of the metal can be easily induced. Further, the eddy current has a property called a skin effect, in which the current flows only on the surface of the metal material, and therefore it is possible that only the surface layer of the metal film is heated and the reflow of the metal can be achieved easily at a lower temperature by activating the skin diffusion.

In this embodiment, the polycrystal wiring layer is single-crystalized by performing the second induction heating; however, even if only the first induction heating is carried out, the metal wiring layer which is made into fluid consists of grains having large diameters, and therefore such a wiring still has a sufficiently high reliability. Naturally, the present invention can be applied to the reflow technique in which a connection hole is filled with metal. Further, in this embodiment, the second induction heating for single-crystalization is carried out after the second wiring formation step; however it is also possible that the second induction heating for single-crystalization is carried out continuously after the first induction heating.

In the case where metal is selectively heated by the induction heating as in this embodiment, the other materials than the metal can be maintained at a low temperature, and therefore the diffusion of impurities at a connection portion, and the diffusion of metal into a semiconductor or an insulation material, can be suppressed.

It should be noted that the inventors of the present invention examined the multi-level Al wiring layers actually obtained in the first to fourth embodiments under a transmission electron microscope, and confirmed that these multi-level Al wiring layers were single-crystal wiring layers. Further, the wiring layers were examined in terms of reliability, and they were confirmed to have high reliabilities.

The present invention is not limited to the above-described embodiments. For example, in the third embodiment, the AlSi alloy film is used as an upper-level wiring layer having a melting point lower than that of the upper-level Al wiring layer; however it is also possible to use an Al alloy film made of a material having a melting point lower than that of Al, for example, a material obtained by adding Ge or the like to Al.

In the first to fourth embodiments, Al or an Al alloy are used as the wiring material; however the materials Cu, Cu alloy, Ag, Ag alloy, Au, Au alloy and the like may be used.

Further, the first to fourth embodiments are described in connection with the case of the two-level single-crystal wiring layer; however the present invention can be applied to a multi-level single-crystal wiring layer of three or more levels.

The above-described embodiments may be combined in an appropriate combination. For example, the first and second embodiments can be combined together. More specifically, after a lower-level single-crystal Al wiring layer is formed, an upper-level polycrystal Al wiring layer made of a material having a melting point lower than that of the lower-level Al wiring layer, and then the upper-level Al wiring layer is single-crystalized by the heat process of the present invention.

The present invention can be remodeled into various different versions as long as the essence of the invention is maintained.

As described above, according to the present invention, even after the formation of, not only the first and second wiring layers (single-crystal wiring layers) which are made of a material in a single-crystal phase, but also the first and second wiring layers (polycrystal wiring layers), the first and second wiring layers (single-crystal wiring layers) which are made of a material in a single-crystal phase, can be formed by carrying out the particular heat treatment of the present invention on these layers, and therefore multi-level wiring layers each having a high reliability can be achieved.

Further, according to the present invention, even when the polycrystal wiring layer (the second wiring) is formed after the formation of the single-crystal wiring layer (the first wiring), the single-crystal property of the first wiring cannot be disturbed while single-crystalizing the second wiring since the melting point of the second wiring is lower than that of the first wiring. Thus, a multi-level wiring layer having a high reliability can be obtained.

According to the present invention, the metal portion can be selectively heated, and the material other than the metal portion can be maintained at a low temperature. Therefore, even in the case where a connection hole having a high aspect ratio is filled with a metal film made into a fluid, the diffusion of impurities at connection portion, or the diffusion of metal to the semiconductor or the insulation material can be suppressed.

Further, according to the present invention, a plug (dummy plug) is built in a predetermined position in a multi-level wiring structure, so that the plug is not connected to other wiring. Atoms can be supplied through the plug even if the transfer of atoms occurs, thus preventing the thinning of the wiring layers. With regard to a polycrystal wiring layer, this structure serves as a source of supplying atoms which moves in a crystal grain boundary. Therefore, the time period for a disconnection to occur due to the electromigration, can be prolonged, thus improving the reliability of the wiring.

What is claimed is:

1. A method of manufacturing a semiconductor device, comprising the steps of:

forming a first wiring layer made of a material of a crystal phase, on a surface of a substrate;

forming a first insulation film for covering said first wiring layer, on said first wiring layer;

forming a connection hole which reaches said first wiring layer in said first insulation film;

forming a conductive film made of a material of a polycrystal phase, on said first insulation film;

forming a second wiring layer on said first insulation film, by processing said conductive film;

forming a second insulation layer for covering said second wiring layer, on said second wiring layers;

removing a surface of said second insulation film until a surface of said second wiring layer is exposed;

forming an opening which reaches said first wiring layer without interfering with said second wiring layer, by etching said first and second insulation films; and converting said first and second wiring layers into first and second single-crystal wiring layers which are connected to each other in said connection hole and are disconnected in said opening, by increasing a temperature of said substrate so that the material of said first wiring layer is converted from a crystal phase to an amorphous phase and the material of said second wiring layer is converted from a polycrystal phase to an amorphous phase, and then decreasing the temperature of said substrate so that these materials are set in a supercooling state.

2. A method of manufacturing a semiconductor device, comprising the steps of:

forming a first wiring layer made of a material of a crystal phase, on a surface of a substrate;

forming an insulation film for covering said first wiring layer, on said first wiring layer;

forming a connection hole which reaches said first wiring layer in said insulation film, and a wiring groove in a surface of said insulation film;

forming a conductive film made of a material of a polycrystal phase, on said insulation film;

forming a second wiring layer in said connection hole and in said wiring groove by removing a portion of said conductive film except for those portions remaining in said connection hole and said wiring groove;

forming an opening which reaches said first wiring layer without interfering with said second wiring layer, by etching said insulation film; and converting said first and second wiring layers into first and second single-crystal wiring layers which are connected to each other in said connection hole and are disconnected in said opening, by increasing a temperature of said substrate so that the material of said first wiring layer is converted from a crystal phase to an amorphous phase and the material of said second wiring layer is converted from a polycrsytal phase to an amorphous phase, and then decreasing the temperature of said substrate so that these materials are set in a supercooling state.

3. A method of manufacturing a semiconductor device, comprising the steps of:

forming a first wiring layer made of a material of a crystal phase, on a surface of a substrate;

forming an insulation film for covering said first wiring layer, on said first wiring layer;

forming a connection hole which reaches said first wiring layer and an opening in said insulation film, and a wiring groove in a surface of said insulation film;

forming a conductive film made of a material of a polycrystal phase, on said insulation film;

forming a second wiring layer in said connection hole, said opening and in said wiring groove by removing said conductive film except for those portions remaining in said connection hole, said opening and said wiring groove; and converting said first and second wiring layers into first and second single-crystal wiring layers which are connected to each other in said connection hole and are disconnected in said opening, by increasing a temperature of said substrate so that the material of said first wiring layer is converted from a crystal phase to an amorphous phase and the material of said second wiring layer is converted from a polycrsytal phase to an amorphous phase, and then decreasing the temperature of said substrate so that these materials are set in a supercooling state.

4. A method of manufacturing a semiconductor device according to either one of claims 1–3, wherein said opening is located at a bent portion of a pattern of said first wiring layer.

5. A method of manufacturing a semiconductor device according to either one of claims 1 to 3, wherein the material of the crystal phase is of a polycrystal or single-crystal material.

6. A method of manufacturing a semiconductor device, comprising the steps of:

forming a first wiring layer made of a material of a crystal phase, on a surface of a substrate;

forming a first insulation film for covering said first wiring layer, on said first wiring layer;

forming a connection hole which reaches said first wiring layer in said first insulation film;

forming a conductive film made of a material of a polycrystal phase and having a melting point lower than that of said first wiring layer, on said first insulation film;

forming a second wiring layer on said first insulation film, by processing said conductive film;

forming a second insulation layer for covering said second wiring layer, on said second wiring layers;

removing a surface of said second insulation film until a surface of said second wiring layer is exposed; and converting said first wiring layer made of a single-crystal material and said second wiring layer made of a polycrystal material into first and second single-crystal wiring layers which are connected to each other in said connection hole, by increasing a temperature of said substrate so that the material of said second wiring layer is converted from a polycrystal phase to an amorphous phase, and then decreasing the temperature of said substrate so that the material is set in a supercooling state.

7. A method of manufacturing a semiconductor device, comprising the steps of:

forming a first wiring layer made of a material of a single-crystal phase, on a surface of a substrate;

forming an insulation film for covering said first wiring layer, on said first wiring layer;

forming a connection hole which reaches said first wiring layer in said insulation film, and a wiring groove in a surface of said insulation film;

forming a conductive film made of a material of a polycrystal phase and having a melting point lower than that of said first wiring layer, on said insulation film;

forming a second wiring layer in said connection hole and said wiring groove by removing a portion of said conductive film except for those portions remaining in said connection hole and said wiring groove; and converting said first wiring layer made of a single-crystal material and said second wiring layer made of a polycrystal material into first and second single-crystal wiring layers which are connected to each other in said connection hole, by increasing a temperature of said substrate so that the material of said second wiring layer is converted from a polycrystal phase to an amorphous phase, and then decreasing the temperature of said substrate so that the material is set in a supercooling state.

8. A method of manufacturing a semiconductor device, comprising the steps of:

forming a first wiring layer made of a material of a crystal phase, on a surface of a substrate;

forming an insulation film for covering said first wiring layer, on said first wiring layer;

forming a connection hole which reaches said first wiring layer in said insulation film, and a wiring groove in a surface of said insulation film;

forming a conductive film made of a material of a polycrystal phase and having a melting point lower than that of said first wiring layer, on said insulation film; and converting said conductive film into a second wiring single-crystal wiring layer which fills said wiring groove and is connected to said first wiring layer in said connection hole, by increasing a temperature of said substrate so that the material of said conductive film is converted from a polycrystal phase to an amorphous phase, and then decreasing the temperature of said substrate so that the material is set in a supercooling state.

9. A method of manufacturing a semiconductor device according to either one of claims 1–3, and 6–8, wherein at least one of said connection hole, said opening and said wiring groove is roughly filled with said conductive film by increasing the temperature of said substrate to a temperature lower than the melting point of said conductive film so that said conductive film is made into fluid, in the step of forming said conductive film made of a material of a polycrystal phase, on the surface of said substrate.

10. A method of manufacturing a semiconductor device, comprising the steps of:

forming an insulation material on a surface of a substrate;

forming both or either of a connection hole and a wiring groove on said insulation material;

forming a metal film on said insulation material so as to make a continuous film in both or either one of inner surfaces of said connection hole and said wiring groove;

filling said metal film into both or either one of said connection hole and said wiring groove by selectively heating said metal film so as to make said metal film into fluid; and forming a wiring layer by removing a portion of said metal film except for portions of both or either one of said connection hole and said wiring groove.

11. A method of manufacturing a semiconductor device according to claim 10, further comprising the step of converting said wiring layer into a single-crystal wiring layer by selectively increasing a temperature of said metal film so that said metal film is converted from a polycrystal phase to an amorphous phase, and then decreasing the temperature of said metal film so that the metal film is set in a supercooling state.

* * * * *